(12) United States Patent
DeMuynck et al.

(10) Patent No.: US 12,381,159 B2
(45) Date of Patent: Aug. 5, 2025

(54) METHOD AND SYSTEM FOR FABRICATING FIDUCIALS FOR PROCESSING OF SEMICONDUCTOR DEVICES

(71) Applicant: SEMICONDUCTOR COMPONENTS INDUSTRIES, LLC, Scottsdale, AZ (US)

(72) Inventors: David DeMuynck, Santa Clara, CA (US); Subhash Srinivas Pidaparthi, Santa Clara, CA (US); Sharlene Wilson, Santa Clara, CA (US); Karthik Suresh Arulalan, Santa Clara, CA (US); Mark Curtice, Santa Clara, CA (US); Andrew P. Edwards, Santa Clara, CA (US); Clifford Drowley, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 436 days.

(21) Appl. No.: 18/097,994

(22) Filed: Jan. 17, 2023

(65) Prior Publication Data
US 2023/0230932 A1   Jul. 20, 2023

Related U.S. Application Data

(60) Provisional application No. 63/300,574, filed on Jan. 18, 2022.

(51) Int. Cl.
*H01L 23/544* (2006.01)
*G03F 9/00* (2006.01)
*H01L 21/308* (2006.01)
*H10D 30/01* (2025.01)

(52) U.S. Cl.
CPC ........ *H01L 23/544* (2013.01); *H01L 21/3086* (2013.01); *H10D 30/024* (2025.01); *G03F 9/708* (2013.01); *H01L 2223/54426* (2013.01)

(58) Field of Classification Search
CPC . G03F 9/7073–708; H01L 2223/54426; H01L 21/308–3083; H01L 21/3086; H01L 21/682
See application file for complete search history.

(56) References Cited

U.S. PATENT DOCUMENTS

2021/0020580 A1\* 1/2021 Drowley ............ H10D 84/0158

\* cited by examiner

*Primary Examiner* — Amar Movva
(74) *Attorney, Agent, or Firm* — Kevin B. Jackson (57) ABSTRACT

A method of forming alignment marks, each alignment mark including a plurality of fiducials, includes providing a III-V compound substrate having a device region and an alignment mark region. The method also includes forming a first hardmask in the device region and a hardmask structure in the alignment mark region, etching a first surface portion of the III-V compound substrate to form a plurality of trenches in the device region, and epitaxially regrowing a semiconductor layer in the trenches. The method further includes forming a second mask in the device region and a patterned structure in the alignment mark region. The patterned structure includes a set of masked regions corresponding to the plurality of fiducials and a second set of openings. The method also includes forming the plurality of fiducials.

13 Claims, 12 Drawing Sheets

☐ Hardmask Area   ▨ Fiducials

☐ Hardmask Area    ▨ Fiducials

METHOD AND SYSTEM FOR FABRICATING FIDUCIALS FOR PROCESSING OF SEMICONDUCTOR DEVICES

CROSS-REFERENCES TO RELATED APPLICATIONS

This application claims the benefit of U.S. Provisional Application No. 63/300,574, filed on Jan. 18, 2022, the contents of which are hereby incorporated by reference in their entirety for all purposes.

BACKGROUND OF THE INVENTION

A sequence of photolithography steps are generally required in the manufacture of semiconductor devices. Accordingly, in order to provide for alignment between a previously processed layer and a current layer, one or more fiducials, also referred to as alignment marks, can be formed as topographical steps or recesses in the processed layer. A protective layer (e.g., silicon oxide) may be formed over the topographical features in order to prevent damage to the fiducials (alignment marks) in a subsequent process. However, the protective layer can limit the resolution of the fiducials and increase the cost and processing time.

For example, some semiconductor fabrication processes require fiducials, i.e., alignment marks, that require at least one and sometimes two or more additional masking steps. The additional fiducials and associated processing add tooling costs, cycle time, and potential defects to the process flow. Thus, there is a need in the art for improved methods and systems related to fiducials.

SUMMARY OF THE INVENTION

The present invention generally relates to fabrication of fiducials or alignment marks during semiconductor processing, for example, during the process flow for the fabrication of a regrown field effect transistor (FET). These fiducials can be used as alignment marks and are tolerant to variations in the regrowth process used to regrow device structures.

As described herein, embodiments of the present invention provide a method of forming alignment marks and semiconductor devices having such alignment marks. In particular, in some semiconductor manufacturing processes, the surface of the semiconductor can be made substantially planar at certain steps in the process. One such process is selective area regrowth to form semiconductor layers embedded within an existing pattern. An example of such a regrowth that provides a substantially planar surface is given in U.S. Pat. No. 9,117,839 (Kizilyalli, et al.). In such a selective area regrowth process, it is desirable to be able to simultaneously form alignment structures having topographic relief relative to the planar regrowth surface.

As described more fully below, embodiments of the present invention enable the formation of fiducials by a combination of patterning and etching of a regrowth hardmask. The methods and systems described herein provide a patterned mask defining fiducials that is uniform despite variations that may be present in the regrowth process. Subsequent photolithography layers can use these fiducials for alignment.

Although fiducials used as components of alignment marks are discussed in some embodiments in relation to semiconductor process flows during fabrication of semiconductor electronic devices, specifically for photolithography exposure tools, this is not required by the present invention and the fiducials discussed herein are applicable in a variety of applications utilizing optical pattern recognition including overlay measurement tools, defect scan tools, metrology tools, wafer testers, and the like.

Numerous benefits are achieved by way of the present invention over conventional techniques. For example, embodiments of the present invention provide alignment marks including a plurality of fiducials that are tolerant to regrowth variation while not adding additional steps to the fabrication process flow. These and other embodiments of the invention along with many of its advantages and features are described in more detail in conjunction with the text below and attached figures.

DETAILED DESCRIPTION OF SPECIFIC EMBODIMENTS

Some semiconductor devices include one or more layers of epitaxially grown semiconductor materials. Selective area metal-organic chemical vapor deposition (SA-MOCVD) is one of the fabrication methods for vertical fin field effect transistor (FinFET) devices.

Figure 1:
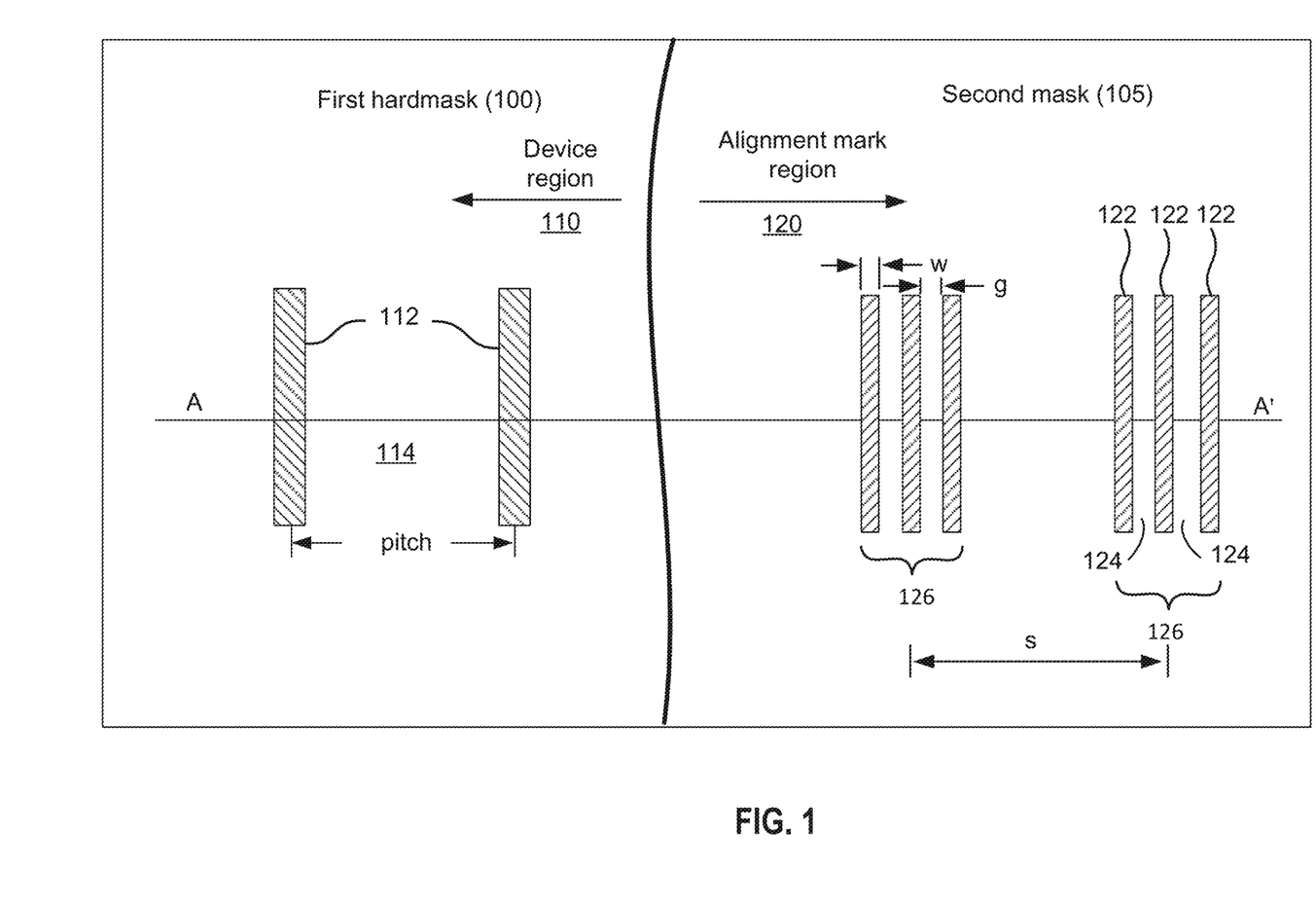
FIG. 1 is a plan view of patterned mask layers including a fin layout in a device region and patterned fiducial masks in an alignment mark region according to an embodiment of the present invention.

FIG. 1 is a plan view of patterned mask layers including a fin layout in a device region and patterned fiducial masks in an alignment mark region according to an embodiment of the present invention. FIG. 1 represents a portion of a larger mask set utilized during fabrication of FinFETs. A method of manufacturing a semiconductor device may include providing a semiconductor substrate, e.g., a III-nitride compound substrate. In an embodiment, the III-nitride compound substrate is an n-type gallium nitride (GaN) substrate on which is grown an n-type GaN epitaxial layer, a second n-type GaN epitaxial layer with a graded dopant concentration, and a third n-type GaN epitaxial layer with a higher dopant concentration than the first epitaxial layer. The method also includes forming a first hardmask on the semiconductor substrate. In addition to GaN substrates, other substrates suitable for supporting regrowth can be utilized, including GaN on silicon carbide (SiC), GaN on silicon, or the like.

As illustrated in FIG. 1, the first hardmask 100 has a device region 110 including a plurality of fin mask areas 112 corresponding to fins that will be protected by the first hardmask. The second mask 105 has an alignment mark region 120 including a plurality of fiducial masks 122 separated by gaps 124. The plurality of fin mask areas 112 are separated by openings 114. More than the two fin mask areas illustrated in FIG. 1 can be utilized and there can be a plurality of openings. In some embodiments, openings 114 between fin mask areas 112 can have a width of about 1.8 µm, the fin mask areas 112 each have a width of about 0.2 µm, and the pitch measured from center-to-center of two adjacent openings 114 can be about 2.0 µm. The second mask 105, in an embodiment, is a photoresist.

In some embodiments, the plurality of fiducial masks 122 can each have a width w ranging from about 0.1 µm to 1.0 µm, for example, 0.1 µm, 0.2 µm, 0.3 µm, 0.4 µm, 0.5 µm, 0.6 µm, 0.7 µm, 0.8 µm, 0.9 µm, 1.0 µm, or greater than 1.0 µm. The gaps 124 each have a gap width g ranging from about 0.1 µm to 2.0 µm, for example, 0.1 µm, 0.2 µm, 0.3 µm, 0.4 µm, 0.5 µm, 0.6 µm, 0.7 µm, 0.8 µm, 0.9 µm, 1.0 µm, 1.5 µm, 2.0 µm, or greater than 2.0 µm. In some embodiments, multiple sets of fiducial masks 126 are provided and the pitch s measured from center-to-center of two adjacent sets of fiducial masks 126 ranges from about 0.2 µm to 2.0 µm, for example, 0.1 µm, 0.2 µm, 0.3 µm, 0.4 µm, 0.5 µm, 0.6 µm, 0.7 µm, 0.8 µm, 0.9 µm, 1.0 µm, 1.25 µm, 1.5 µm, 1.75 µm, 2 µm, or greater than 2.0 µm. Other embodiments can utilize other values for the width w and the pitch s measured from center-to-center spacing of two adjacent sets of fiducial masks as well as the gap width g and center-to-center spacing of the gaps and these values are merely exemplary. One of ordinary skill in the art would recognize many variations, modifications, and alternatives.

It should be appreciated that although each set of fiducial masks 126 is illustrated by three fiducial masks 122, this is merely exemplary and in other embodiments, each set of fiducial masks 126 includes one, two, three, four, five, six, seven, eight, nine, ten, eleven, twelve, thirteen, fourteen, fifteen, or more than fifteen fiducial masks, with the width of the set of fiducial masks 126 being in the range of several microns, the width w of the fiducial masks 122 being in the range of sub-micron to several microns, and the pitch s measured from center-to-center of two adjacent sets of fiducial masks 126 being in the range of several to tens of microns.

Although only a portion of the first hardmask 100 in the device region 110 and the second mask 105 in the alignment mark region 120 are illustrated in FIG. 1, it will be appreciated that both the device region 110 and the alignment mark region 120 will include additional mask patterns and a single substrate can support multiple device regions and alignment mark regions. One of ordinary skill in the art would recognize many variations, modifications, and alternatives.

Figure 2A:
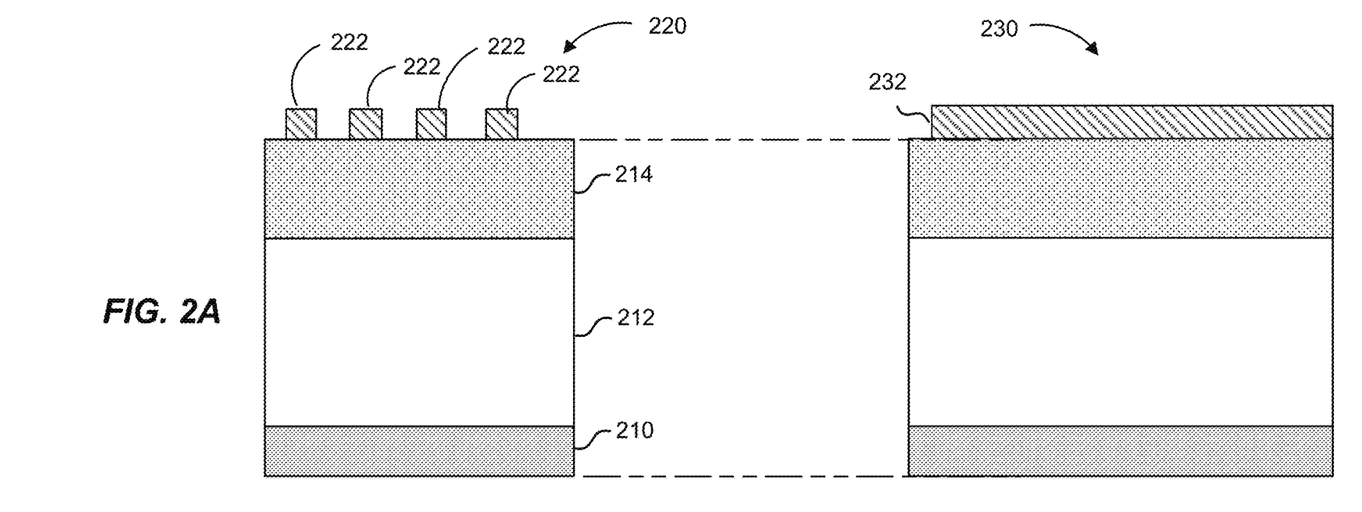
FIG. 2A is a partial cross-sectional view of a first hardmask according to an embodiment of the present invention.

FIG. 2A is a partial cross-sectional view of a first hardmask taken along line A-A' in FIG. 1 according to an embodiment of the present invention. In FIG. 2A, substrate 210, drift layer 212 (also referred to as a first semiconductor, e.g., III-N, layer), and channel layer 214 (also referred to as a second semiconductor, e.g., III-N, layer) are illustrated in conjunction with the structure of a FinFET, but other semiconductor layers can be utilized as appropriate to the particular application. A hardmask layer (not shown) is formed on channel layer 214. The hardmask layer can include one or more dielectrics such as oxides and/or nitrides or other suitable materials (including, e.g., refractory metals, metal alloys or metal compounds) that can be deposited, patterned, withstand etching processes, and withstand high temperature regrowth processes. In some embodiments, the hardmask layer has a main lateral surface coinciding with the (0001) plane of the semiconductor substrate, which may be a gallium nitride (GaN) substrate. In some embodiments, the semiconductor substrate may be misoriented from the <0001> direction by an angle.

According to embodiments of the present disclosure, the hardmask material may include silicon dioxide, silicon nitride, aluminum nitride, aluminum oxide, titanium nitride, hafnium oxide, combinations thereof, or the like. The thickness of the hardmask material can vary from a few nanometers to about 500 nm. Conventional photolithographic semiconductor processes may include, e.g., spin coating a photoresist on the hardmask material, selectively exposing the photoresist to light, developing the photoresist, and etching the hardmask material using the photoresist as a mask. In one embodiment, the hardmask material can be deposited by plasma enhanced chemical vapor deposition (PECVD). In one embodiment, the hardmask material can be deposited by low pressure PECVD (LPCVD). In one embodiment, the hardmask material can be deposited by physical vapor deposition (PVD), e.g., sputtering.

In the device region 220, which corresponds to device region 110 illustrated in FIG. 1, a set of fin mask areas 222 have been formed using a patterning and etching process to pattern the first hardmask. As described more fully below, the first hardmask will be utilized as both an etch mask during the etching process used to form the fins of the FinFETs as well as a regrowth mask during regrowth of the gate layer. Moreover, in the alignment mark region 230, which corresponds to alignment mark region 120 illustrated in FIG. 1, during subsequent processing steps, the first hardmask will be patterned using a second mask in order to form fiducials. Thus, according to embodiments of the present invention, the regrowth hardmask, i.e., the first hardmask, is converted into fiducials in the alignment mark region 230.

The first hardmask is not initially patterned in the alignment mark region 230, resulting in a hardmask 232 with a uniform structure. As discussed in relation to FIG. 1, only a portion of the alignment mark areas typically used during semiconductor processing are illustrated for purposes of clarity. As described more fully below, the hardmask 232 will be utilized for the formation of fiducials in a later stage of processing. As illustrated in FIG. 2A, the device region 220 is patterned while the alignment mark region 230, which corresponds to alignment mark region 120 illustrated in FIG. 1, is generally unpatterned at this stage of processing.

Figure 2B:
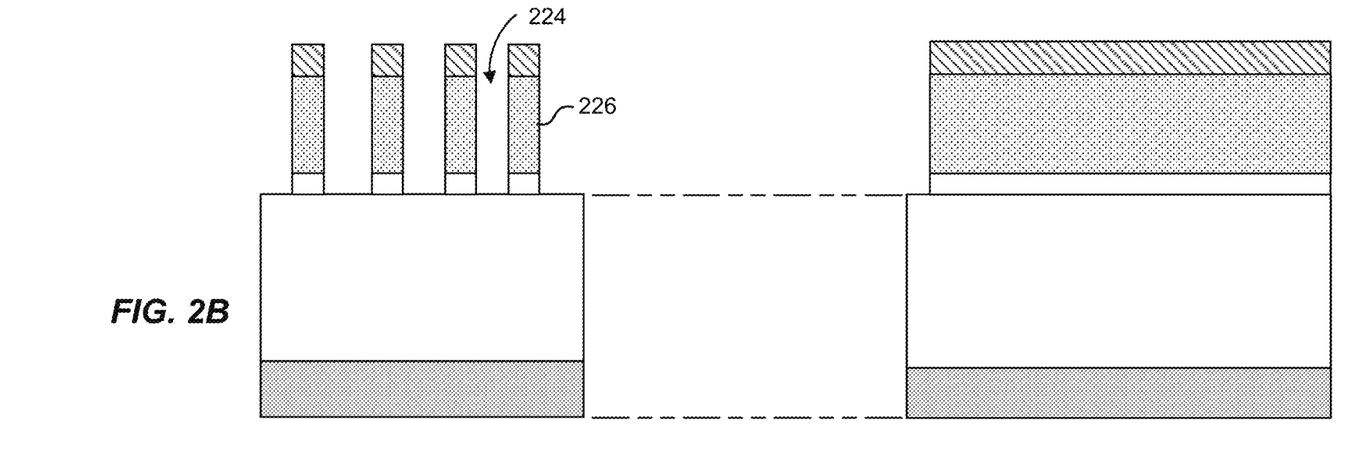
FIG. 2B is a partial cross-sectional view of formation of patterned trenches according to an embodiment of the present invention.

FIG. 2B is a partial cross-sectional view of formation of patterned trenches according to an embodiment of the present invention. As illustrated in FIG. 2B, using the first hardmask including the set of fin mask areas 222, a set of fin trenches 224 are formed in the device region 220 in order to define fins 226. In one embodiment, the fin trenches 224 each may have a depth of 0.8 µm. In order to provide a uniform depth for the fin trenches 224, good controllability of the etch process is utilized. In some embodiments, an etch process may include chlorine-based chemistry using reactive ion etching (RIE) to form the fin trenches 224, and a cleaning process may be carried out using a tetramethylammonium hydroxide (TMAH) solution after etching the semiconductor substrate. The fin trenches 224 include sidewalls that are substantially perpendicular to the main surface of the semiconductor substrate. In some embodiments, the trench sidewalls in the device region are substantially parallel to the GaN m-plane. As discussed above, although only three fin trenches 224 in the device region and four fins 226 are illustrated in FIG. 2B, it will be appreciated that this particular design is merely exemplary and other designs with different numbers of fin trenches and fins are included within the scope of the present invention.

Figure 2C:
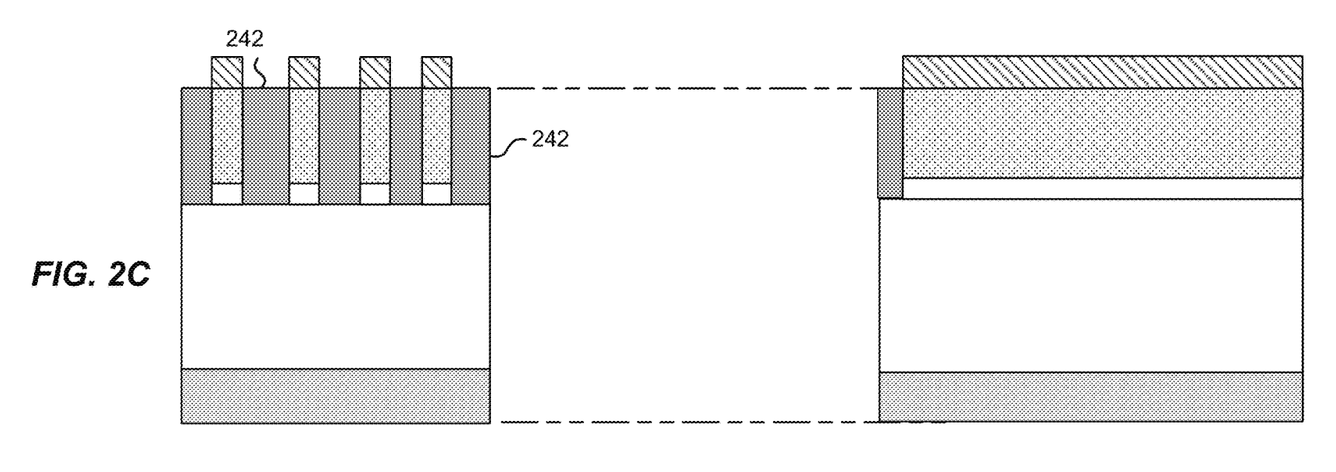
FIG. 2C is a partial cross-sectional view of regrowth in the device region and the alignment mark region according to an embodiment of the present invention.

FIG. 2C is a partial cross-sectional view of regrowth in the device region and the alignment mark region according to an embodiment of the present invention. As illustrated in FIG. 2C, a semiconductor material is epitaxially regrown in the fin trenches until the semiconductor material is substantially coplanar with the base of the first hardmask in the device region. In one embodiment, the regrowth process may be a p-GaN regrowth by metalorganic chemical vapor deposition (MOCVD) that allows good in-plane control of thickness, strain, and bandgap energy. Accordingly, in a FinFET implementation, regrown gates are formed using regrown material 242.

At the same time, the semiconductor material is also epitaxially regrown in unmasked areas of the alignment mark region. In the illustrated embodiment, the regrowth in the alignment mark region is substantially coplanar with that in the device region, although this is not required and, in other embodiments, the regrowth in the alignment mark region is characterized by a height between the upper surface of the channel layer and the upper surface of the first hardmask. One of ordinary skill in the art would recognize many variations, modifications, and alternatives.

Additional description related to regrowth of semiconductor material is provided in commonly assigned U.S. Patent Application Publication No. 2021/0020580, published on Jan. 21, 2021, the disclosure of which is hereby incorporated by reference in its entirety for all purposes.

Figure 2D:
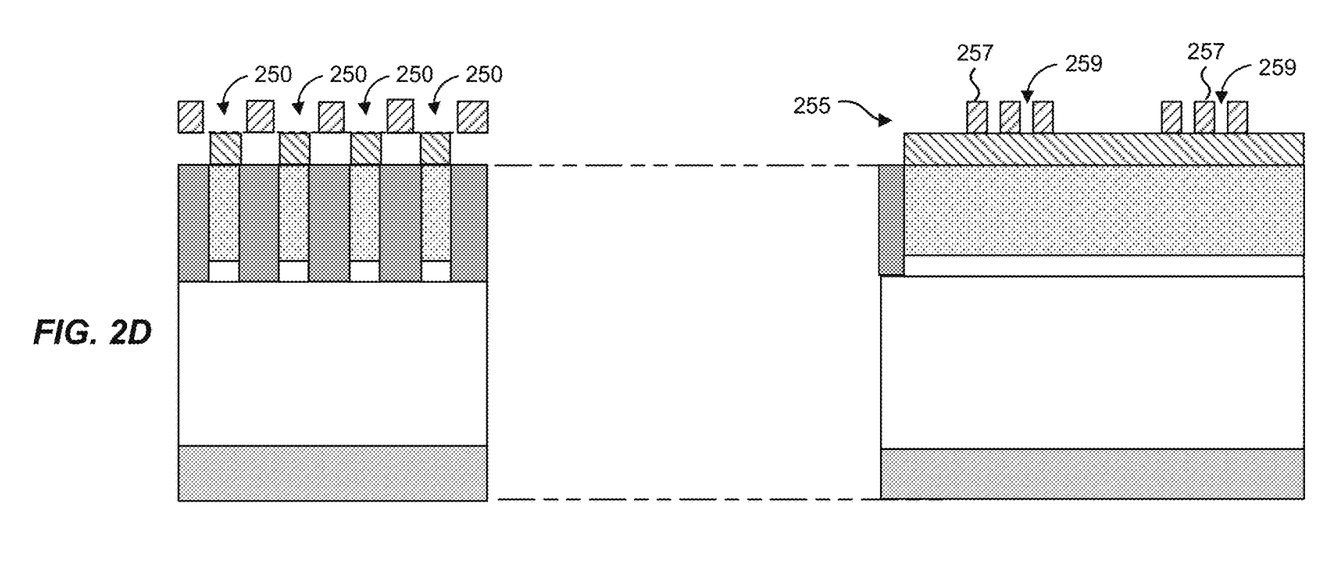
FIG. 2D is a partial cross-sectional view of patterning of a second mask in the device region and the alignment mark region according to an embodiment of the present invention.

FIG. 2D is a partial cross-sectional view of patterning of a second mask in the device region and the alignment mark region according to an embodiment of the present invention. In FIG. 2D, a second mask has been patterned to form fin mask removal areas 250 in the device region and a patterned structure 255 in the alignment mark region. The patterned structure 255 includes fiducial mask areas 257 and openings 259 between adjacent fiducial mask areas 257. As described more fully below, the fiducial mask areas 257 will be utilized to define fiducials that are formed during an etching process using the second mask.

Figure 2E:
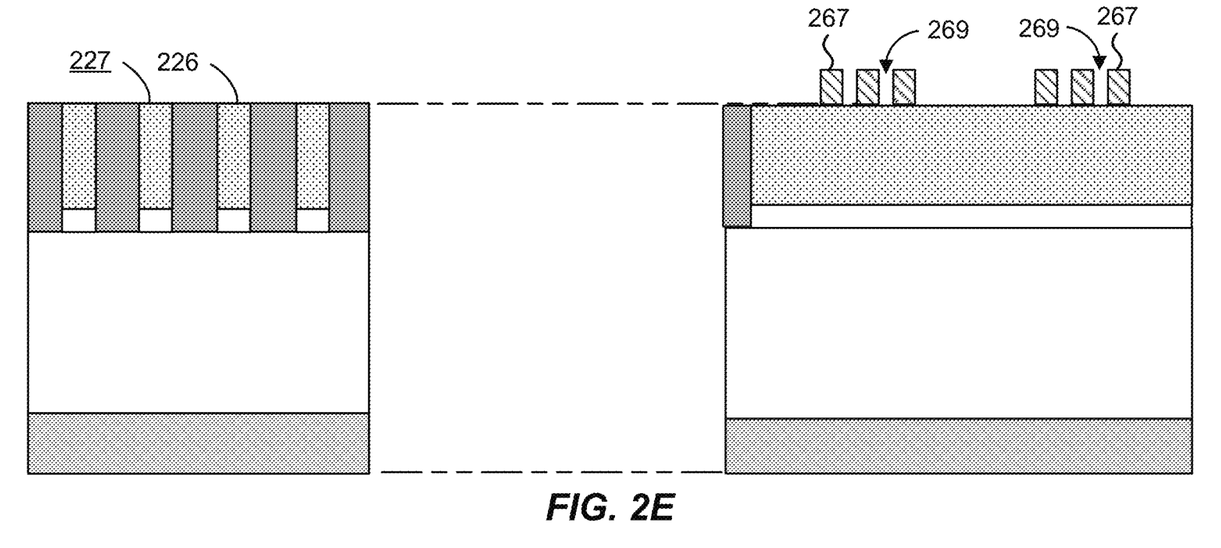
FIG. 2E is a partial cross-sectional view of the device region and the alignment mark region after removal of the first hardmask and the second mask in the device region and the second mask and portions of the first hardmask in the alignment mark region according to an embodiment of the present invention.

FIG. 2E is a partial cross-sectional view of the device region and the alignment mark region after removal of the first hardmask and the second mask in the device region and the second mask and portions of the first hardmask in the alignment mark region according to an embodiment of the present invention. As illustrated in FIG. 2E, in the device region, the first hardmask, which had been used to form the fins and served as a regrowth mask during growth of the regrown semiconductor layer, has been removed, exposing the top surface 227 of the fins 226. Additionally, the second mask in the device region, which was used during the removal of the first hardmask in the device region, has also been removed. In the alignment mark region, the patterned structure 255 formed in the second mask and illustrated in FIG. 2D has been used to pattern the first hardmask, forming fiducials 267 separated by gaps 269. In FIG. 2E, the second mask has also been removed in the alignment mark region.

Although the process illustrated in FIGS. 2A-2E is related to vertical regrowth in the context of junction field effect transistors (JFETs), this particular device structure is not required and other embodiments are applicable to the regrowth of lateral transistors. Moreover, as an alternative embodiment related to regrown JFETs, some embodiments utilize p-GaN for the fins of the FinFET and n-GaN for the regrown gate instead of the illustrated device that utilizes n-GaN for the fins of the FinFET and p-GaN for the regrown gate. One of ordinary skill in the art would recognize many variations, modifications, and alternatives.

Figure 3A:
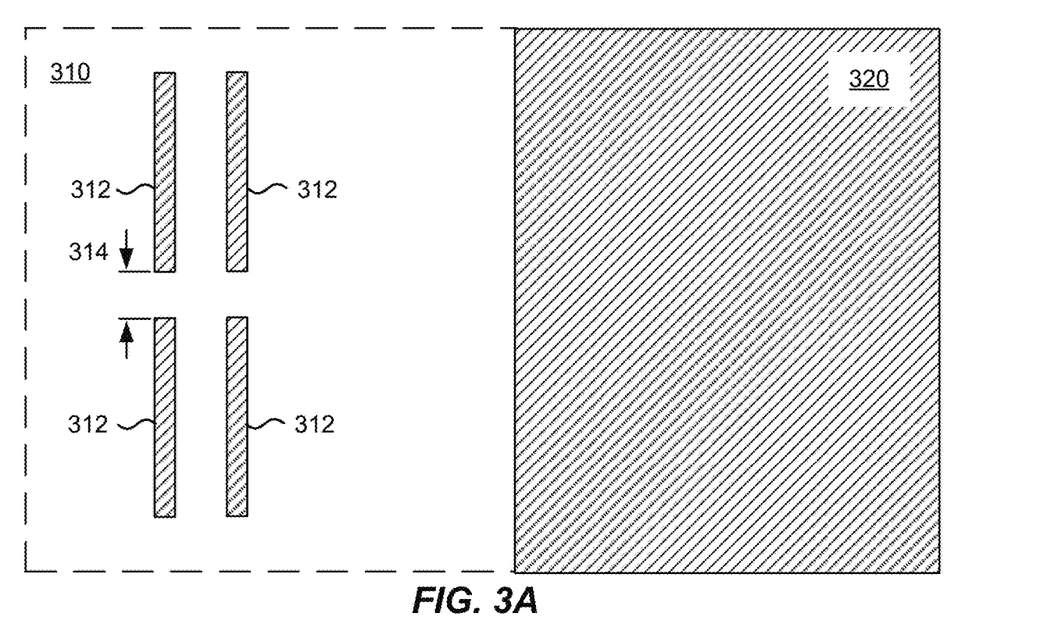
FIG. 3A is a plan view of a first patterned hardmask defining fin mask areas in the device region according to an embodiment of the present invention.

FIG. 3A is a plan view of a first patterned hardmask defining fin mask areas in the device region according to an embodiment of the present invention. In the device region 310, which corresponds to device region 110 illustrated in FIG. 1, two sets of fin mask areas, each including two fin mask areas 312 having a width and a length, with a gap 314 disposed between fin mask areas along the length direction, are illustrated. Of course, these numbers for the sets and the fin mask areas are merely exemplary. In the alignment mark region 320, which corresponds to alignment mark region 120 illustrated in FIG. 1, the first hardmask covers a predetermined area in which fiducials will be fabricated. Thus, in FIG. 3A, the first hardmask geometry in the hardmask area is illustrated as a solid hardmask, which can also be referred to as a hardmask structure.

Figure 3B:
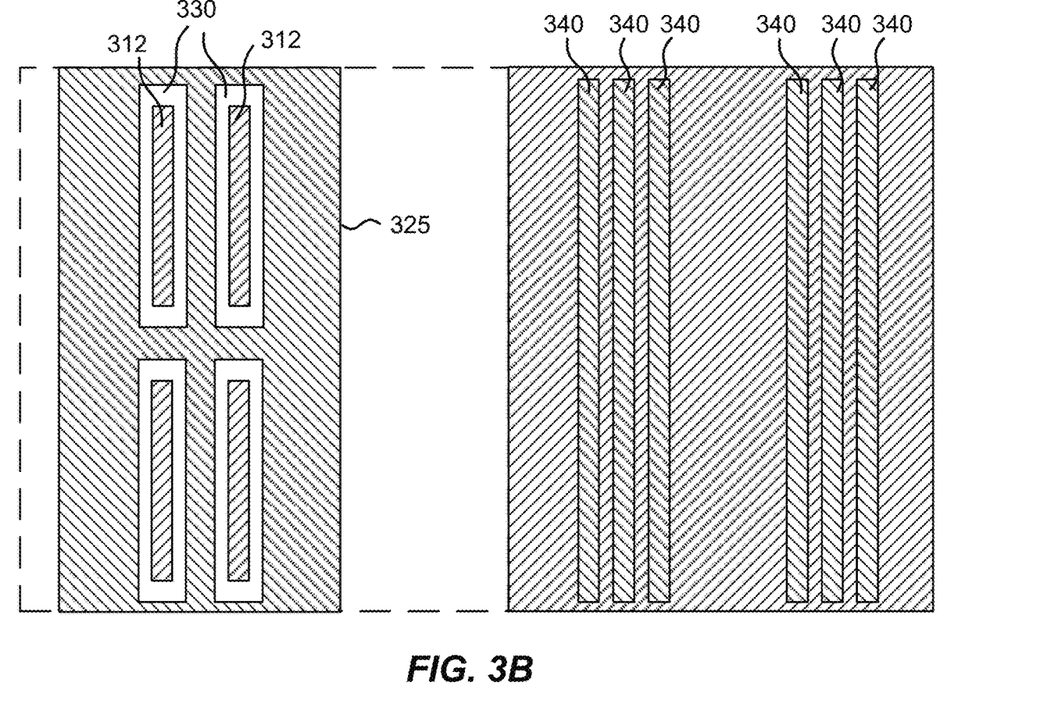
FIG. 3B is a plan view of a second patterned mask defining fin mask removal areas in the device region and fiducial mask areas in the alignment mark region.

FIG. 3B is a plan view of a second patterned mask defining fin mask removal areas in the device region and fiducial mask areas in the alignment mark region. Referring to FIG. 3B, the second patterned mask 325 in the device region has been patterned to form openings 330 around the fin mask areas 312, enabling the mask used during formation of the fins to be removed during an etching process using the second patterned mask 325 in the device region. In the alignment mark region, the second patterned mask has been patterned to form a set of fiducial masks 340 enabling the first hardmask to be patterned to form fiducials in the first hardmask in the alignment mark region. Although the second patterned mask 325 in the device region is illustrated as a patterned mask in this embodiment, this mask, with different patterning, can also be utilized during blanket removal of the first hardmask in the device region while using the second patterned mask to form the fiducials in the alignment mark region in other embodiments.

Figure 4:
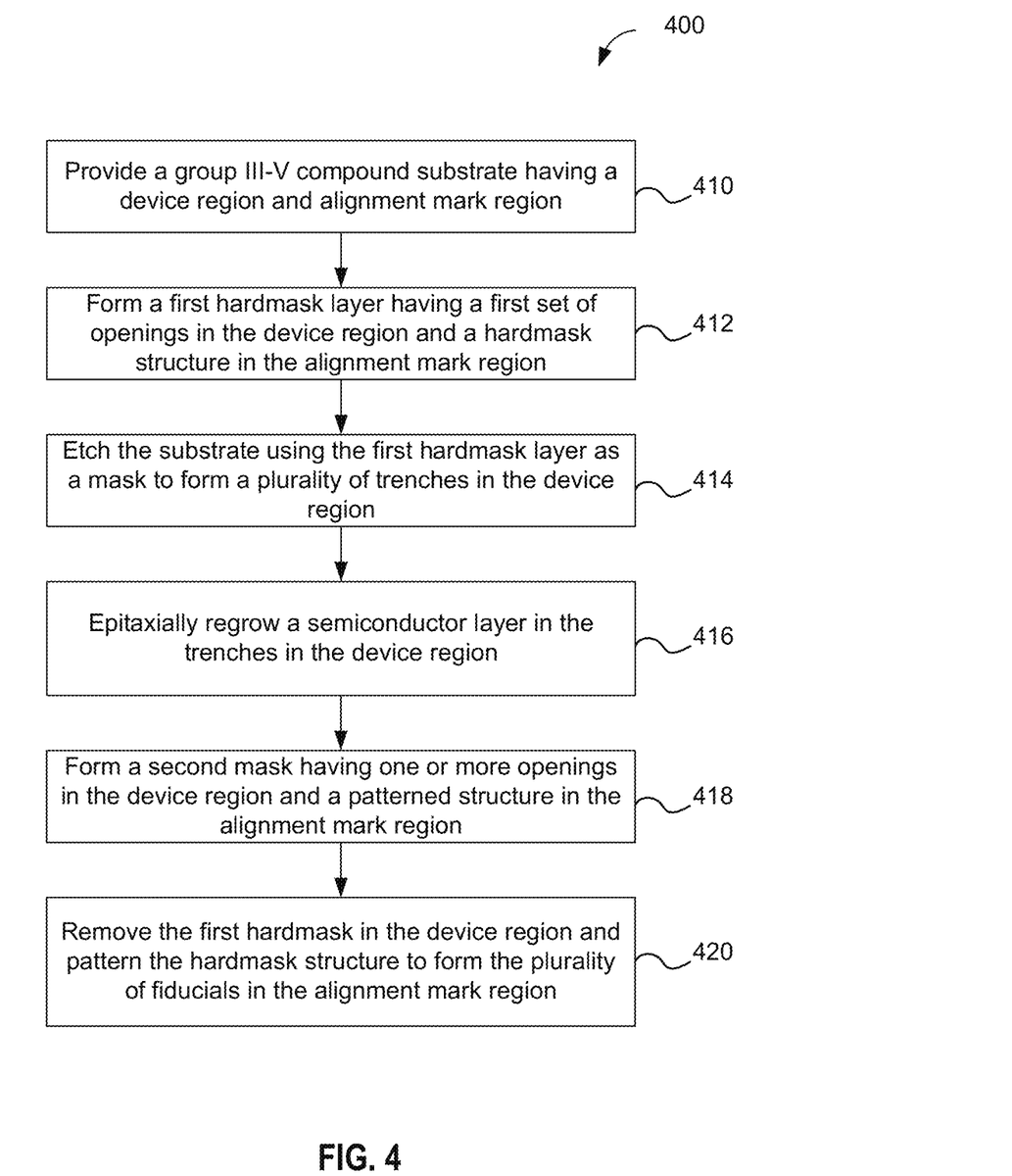
FIG. 4 is a simplified flowchart illustrating a method of forming fiducials during the formation of integrated circuits on semiconductor wafers according to an embodiment of the present invention.

FIG. 4 is a simplified flowchart illustrating a method of forming alignment marks, each alignment mark including a plurality of fiducials according to an embodiment of the present invention. The method can be utilized during the formation of integrated circuits on semiconductor wafers. The method 400 includes providing a III-V compound substrate having a device region and an alignment mark region (410). The III-V compound substrate is characterized by a processing surface. The III-V compound substrate can include a GaN substrate and a plurality of epitaxial III-V layers. The III-V compound substrate can include an n-GaN epitaxial layer.

The method also includes forming a first hardmask having a first set of openings in the device region exposing a first surface portion of the processing surface of the III-V compound substrate and a hardmask structure in the alignment mark region (412). In one embodiment, the first hardmask is formed from a hardmask layer that includes silicon nitride and may be formed on the substrate by a PECVD or a LPCVD process. The hardmask layer is then patterned by lithography that includes forming a patterned photoresist on the hardmask layer and then etching the hardmask layer to form a patterned hardmask layer. As illustrated herein, the first hardmask has a first set of openings in the device region exposing a first surface portion of the processing surface of the III-V compound substrate. The first set of openings can include an array of elongated openings arranged in parallel to each other and configured to form a plurality of semiconductor fins. The elongated openings can each have a width in a range between about 0.2 μm and about 3 μm, a length in a range between about 100 μm and about 1,000 μm, and a pitch between two adjacent elongated openings can be in a range between about 1.8 μm and about 10 μm. The hardmask structure can be a solid structure as illustrated in FIG. 3A.

The method further includes etching the first surface portion of the III-V compound substrate using the first hardmask layer as a mask to form a plurality of trenches in the device region (414) and epitaxially regrowing a semiconductor layer in the trenches (416). The semiconductor layer can include a p-GaN epitaxial layer. The epitaxially regrown semiconductor material in the trenches in the device region can form the gates of the FinFETs. Additionally, the method includes forming a second mask having one or more openings in the device region and a patterned structure in the alignment mark region (418). The patterned structure includes a set of masked regions corresponding to the plurality of fiducials and a second set of openings. The method also includes removing, using the second mask, the first hardmask in the device region and a portion of the first hardmask in the alignment mark region corresponding to the second set of openings to form the plurality of fiducials (420). As illustrated in FIGS. 2D and 2E, each of the plurality of fiducials 267 correspond to one of the masked regions of the set of masked regions, i.e., one of the fiducial mask areas 257 of the patterned structure 255. Additionally, the second set of openings 259 in the patterned structure are positioned between fiducial mask areas 257 of the patterned structure (i.e., the set of masked regions). In an embodiment, the second mask is a patterned photoresist layer. In an embodiment, the portion of the first hardmask not protected by the fiducial mask areas 257 can be removed using a reactive ion etch. In an embodiment, the reactive ion etch utilizes a fluorine-based chemistry.

The trenches can each have a depth of about 0.8 μm and a width of about 1.8 μm. The plurality of fiducials can each have a width between 0.1 μm and 1 μm and a pitch between 0.2 μm and 1.2 μm. In some embodiments, the trenches in the device region are characterized by a first pitch and the plurality of fiducials are characterized by a second pitch less than the first pitch. A set of the plurality of fiducials in the alignment mark region form an alignment mark. Each of the plurality of fiducials can be elongated and a length of each of the plurality of fiducials can be parallel to an m-plane of the III-V compound substrate. The first set of openings can include an array of elongated openings arranged in parallel to each other configured to form a plurality of semiconductor fins. The elongated openings can each have a width in a range between about 0.2 μm and about 0.3 μm, a length in a range between about 100 μm and about 1000 μm, and a pitch between two adjacent elongated openings can be in a range between about 1.9 μm and about 10 μm.

It should be appreciated that the specific steps illustrated in FIG. 4 provide a particular method of forming alignment marks according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
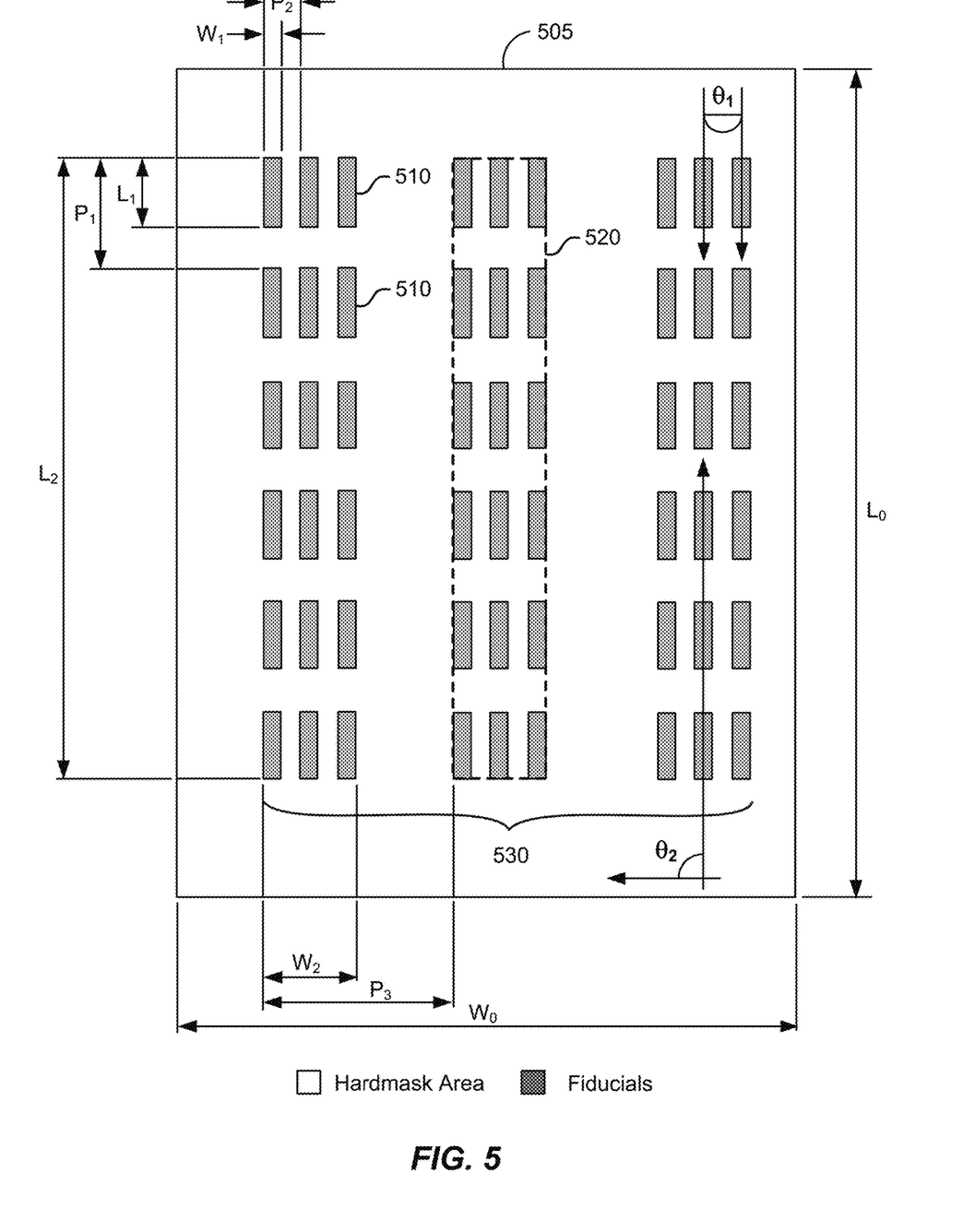
FIG. 5 is a plan view of fiducials in the alignment mark region according to an embodiment of the present invention.

FIG. 5 is a plan view of fiducials in the alignment mark region according to an embodiment of the present invention. In FIG. 5, fiducials 510 are illustrated along with hardmask area 505. Each of the fiducials 510 is characterized by length $L_1$ and a width $W_1$. In this example, each set of fiducials includes six rows and three columns of fiducials. Each set of fiducials, which can be referred to as an alignment mark 520, is characterized by a length $L_2$ and a width $W_2$. Of course, this number of rows and columns of fiducials in each alignment mark and the number of alignment marks, three in this example, is merely exemplary. Each fiducial is separated from other fiducials in the set by pitch $P_1$ in the length direction and pitch $P_2$ in the width direction. Accordingly, $P_1$ can be referred to as a longitudinal pitch since it is measured along the length of the fiducials, whereas $P_2$ can be referred to as a lateral pitch since it is measured along the width of the fiducials. As stated above, each set of fiducials makes up an alignment mark 520 and, in this example, three alignment marks make up an alignment mark pattern 530. Each alignment mark is separated from the other alignment marks by pitch $P_3$ in the width direction. Thus, each alignment mark pattern will include a plurality of periodically arranged alignment marks, which can be regularly spaced in an arrayed manner to form the alignment mark pattern 530. The alignment marks can be linear, rectangular, circular, squares, combinations thereof, or the like.

The hardmask area has a width $W_0$ and a length $L_0$. Within each set of fiducials, the fiducials can be oriented at any angle $0° \leq \theta_1 \leq 180°$ with respect to each other. Additionally, each set of fiducials can be oriented at any angle $0° \leq \theta_2 \leq 90°$ with respect to the hardmask area.

When the resolution of the camera used during imaging of the fiducials is characterized by a lower resolution than the size of the fiducials, for example, the spacing between adjacent fiducials in the width direction or the length direction, the image formed by the camera for the pattern illustrated in FIG. 5 will be of three vertical lines, each corresponding to a single alignment mark 520, separated by pitch $P_3$. For example, the width $W_1$ can range from about 0.1 μm to 1.0 μm, for example, 0.1 μm, 0.2 μm, 0.3 μm, 0.4 μm, 0.5 μm, 0.6 μm, 0.7 μm, 0.8 μm, 0.9 μm, 1.0 μm, or greater than 1.0 μm. The pitch $P_2$ in the width direction can range from about 0.2 μm to 4.0 μm, resulting in the gap between fiducials in the width direction (i.e., $P_2-W_1$) being in the range of 0.1 μm to 3.9 μm, for example, 0.2 μm, 0.3 μm, 0.4 μm, 0.5 μm, 0.6 μm, 0.7 μm, 0.8 μm, 0.9 μm, 1.0 μm, 1.5 μm, 2.0, μm, 2.5 μm, 3.0 μm, 3.5 μm, or greater than 3.5 μm. The width $W_1$ can be half of the pitch $P_2$, resulting in the fiducials and the gap between fiducials being equal, or the pitch $P_2$ can be less than the width $W_1$ or greater than twice the width $W_1$, resulting in different array configurations for the fiducials, depending on the particular application.

The dimensions of each alignment mark 520, including width $W_2$ and length $L_2$, can also vary as appropriate to the particular application. The width $W_2$ can range from sub-micron to tens of microns, for example, less than 1 μm, 1.5 μm, 2 μm, 2.5 μm, 3 μm, 3.5 μm, 4 μm, 4.5 μm, 5 μm, 6 μm, 7 μm, 8 μm, 9 μm, 10 μm, or greater than 10 μm. The pitch $P_3$ at which each alignment mark 520 is arrayed can be in the range of one to tens of microns, for example, 1 μm, 1.5 μm, 2 μm, 2.5 μm, 3 μm, 3.5 μm, 4 μm, 4.5 μm, 5 μm, 6 μm, 7 μm, 8 μm, 9 μm, 10 μm, 11 μm, 12 μm, 13 μm, 14 μm, 15 μm, 20 μm, 25 μm, 30 μm, or greater than 30 μm.

Accordingly, referring to FIG. 5, a photolithography tool manufacturer may specify or recommend the dimensions associated with alignment marks in a set of alignment marks. As an example, a photolithography tool manufacturer could specify that a set of alignment marks includes a plurality of alignment marks, for example, a set of two to 15 alignment marks, each having dimensions of $L_2 \times W_2$ and a pitch of $P_3$. The set of alignment marks can be arrayed in the direction of their width, with the three alignment marks having dimensions of $L_2 \times W_2$ illustrated in FIG. 5 making up an alignment mark pattern 530 including the set of three alignment marks. Within each alignment mark 520, a plurality of fiducials 510 are arrayed, in either the width direction, the length direction, or both, thereby subdividing each alignment mark into smaller units corresponding to the fiducials. For example, the pitch of the fiducials in the width direction can be less than the pitch of the alignment marks in the width direction, illustrated in FIG. 5 by pitch $P_2$ being less than pitch $P_3$. Additionally, in the embodiment illustrated in FIG. 5, the length of each alignment mark can be subdivided into a set of fiducials with pitch $P_1$ being less than $L_2$.

In addition to the pitch of the fiducials being less than the pitch of the alignment mark, resulting in the alignment mark being subdivided into smaller units, the dimensions and pitch of the fiducials can be compared to the dimensions and/or pitch of the electronic devices fabricated on the substrate on which the alignment marks are formed. As an example, the pitch of the fiducials in the width direction can be less than the pitch of the FinFETs fabricated in the device region. Thus, in addition to use of the alignment marks as a reference, the electronic devices, including FinFETs can be utilized as the reference to which the dimensions and/or pitch of the fiducials are compared. Using fiducials with dimensions smaller than the alignment marks, the contrast associated with each alignment mark can be increased in comparison to designs in which the alignment mark is formed as a single structure.

It should be noted that there are multiple variations corresponding to the layout of the fiducials and the alignment marks. A number of these variations are discussed in the following figures. For example, $L_0$, $W_0$, $L_1$, $W_1$, $P_1$, $P_2$, $L_2$, $W_2$, and/or $P_3$, can have values of zero or any positive real number value. Additionally, $\theta_1$, $\theta_2$ can have any positive real number value such that $0° \leq \theta_1 \leq 180°$ and $0° \leq \theta_2 \leq 90°$ respectively.

Figure 6A:
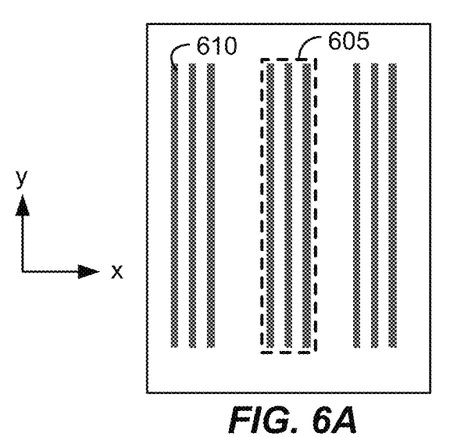
FIGS. 6A and 6B are plan views of fiducials for a set of X alignment marks and a set of Y alignment marks, respectively, according to a first embodiment of the present invention.
Figure 6B:
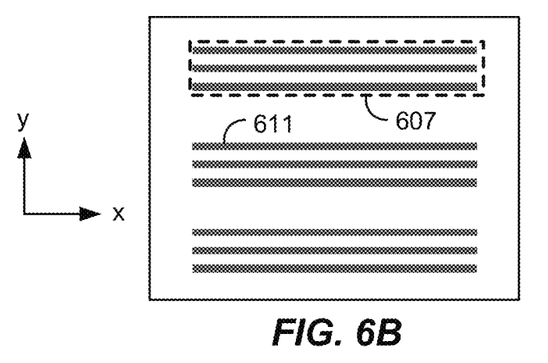

FIGS. 6A and 6B are plan views of fiducials for a set of X alignment marks and a set of Y alignment marks, respectively, according to a first embodiment of the present invention. In FIGS. 6A and 6B, the long axes for the x-direction alignment marks and y-direction alignment marks are orthogonal. Thus, in this embodiment, three x-direction alignment marks including alignment mark 605 are illustrated in FIG. 6A, with each alignment mark 605 being formed by a set of three fiducials 610, with the length of the fiducials being orthogonal to the x-direction. For the three alignment marks 607 arrayed in the y-direction as illustrated in FIG. 6B, the length of the fiducials 611 in each alignment mark is parallel to the x-direction.

In FIG. 6A, an alignment mark pattern including three alignment marks is illustrated, with each alignment mark 605 including three fiducials 610, although this number of alignment marks and this number of fiducials are merely exemplary. As described herein, embodiments of the present invention utilize alignment marks that are made up of a plurality of smaller fiducials. The smaller fiducials will have at least one dimension (e.g., width or length) that is smaller than the corresponding dimension of the alignment mark. In FIG. 6A, the width of the fiducials is less than the width of the alignment mark while the length of the fiducials and the length of the alignment mark is equal. In other embodiments, both dimensions of the fiducials are smaller than the corresponding dimensions of the alignment mark. In FIG. 6B, each alignment mark 607 includes three fiducials 611, although this number of fiducials is merely exemplary. In FIG. 6B, the width of the fiducials is less than the width of the alignment mark while the length of the fiducials and the length of the alignment mark is equal.

Figure 7A:
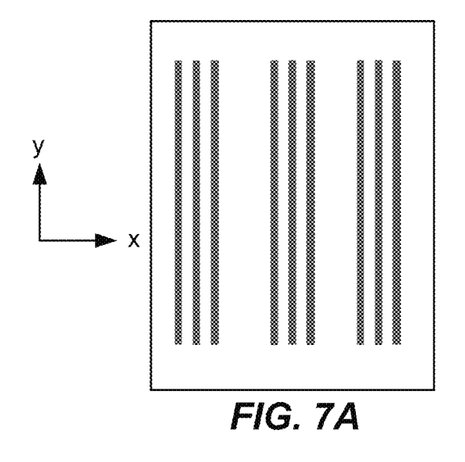
FIGS. 7A and 7B are plan views of fiducials for a set of X alignment marks and a set of Y alignment marks, respectively, according to a second embodiment of the present invention.
Figure 7B:
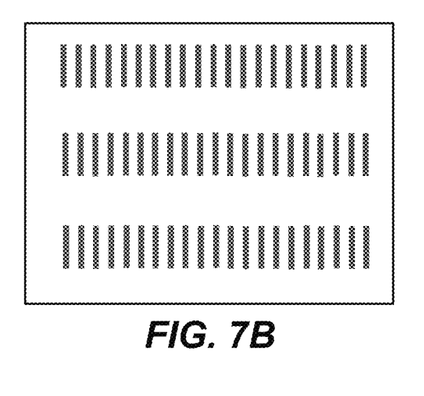

FIGS. 7A and 7B are plan views of fiducials for a set of X alignment marks and a set of Y alignment marks, respectively, according to a second embodiment of the present invention. In FIGS. 7A and 7B, the fiducials in the x-direction alignment marks illustrated in FIG. 7A have their lengths aligned with the y-direction and the fiducials in the y-direction alignment marks illustrated in FIG. 7B also have their lengths aligned with the y-direction.

Figure 7C:
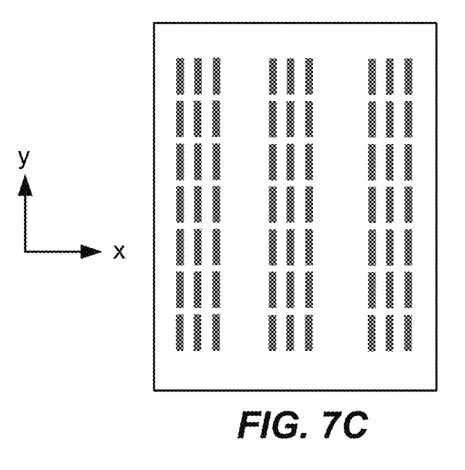
FIGS. 7C and 7D are plan views of fiducials for a set of X alignment marks and a set of Y alignment marks, respectively, according to a third embodiment of the present invention.
Figure 7D:
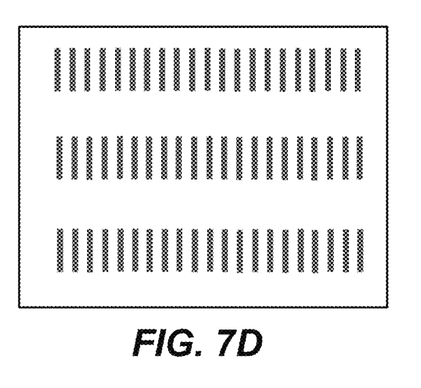

FIGS. 7C and 7D are plan views of fiducials for a set of X alignment marks and a set of Y alignment marks, respectively, according to a third embodiment of the present invention. For the x-direction alignment marks illustrated in FIG. 7C, each of the fiducials in each of the three alignment marks has an equal area. The area of each of the fiducials can be equal to the area of each of the fiducials in each of the three y-direction alignment marks shown in FIG. 7D. In a manner similar to the fiducials illustrated in FIG. 7B, the lengths of the fiducials illustrated in both FIGS. 7C and 7D are reduced in comparison to the fiducials illustrated in FIG.

7A. In FIG. 7C, the length of the fiducials making up each alignment mark is parallel to the length of the alignment mark, whereas in FIG. 7D, the length of the fiducials making up each alignment mark is orthogonal to the length of the alignment mark.

Figure 8A:
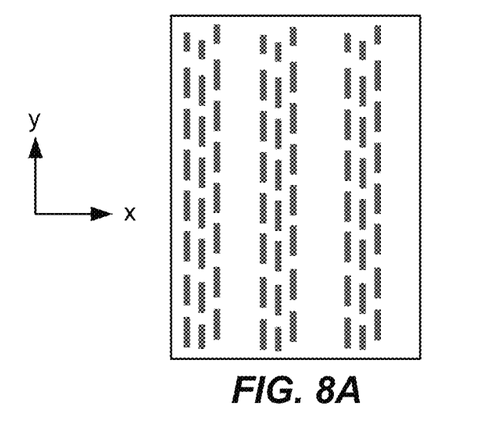
FIGS. 8A and 8B are plan views of fiducials for a set of X alignment marks and a set of Y alignment marks, respectively, according to a fourth embodiment of the present invention.
Figure 8B:
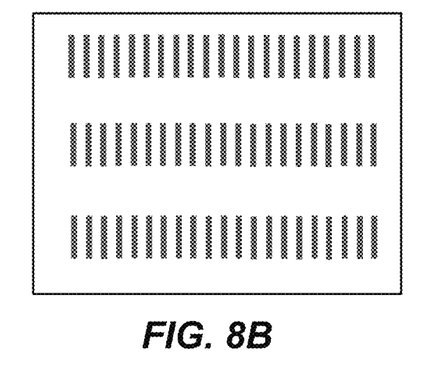

FIGS. 8A and 8B are plan views of fiducials for a set of X alignment marks and a set of Y alignment marks, respectively, according to a fourth embodiment of the present invention. In this embodiment, the x-direction alignment marks are similar to those illustrated in FIG. 7C, but with each column of fiducials within the alignment marks offset along the length of the alignment marks. The fiducials illustrated in FIG. 8B are similar to those illustrated in FIG. 7B.

Figure 8C:
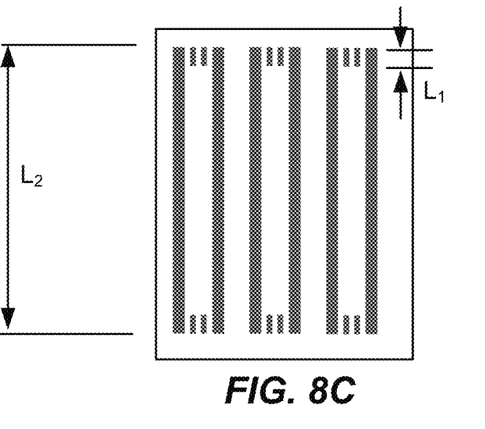
FIGS. 8C and 8D are plan views of fiducials for a set of X alignment marks and a set of Y alignment marks, respectively, according to a fifth embodiment of the present invention.
Figure 8D:
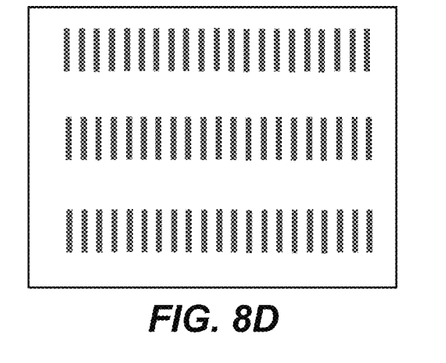

FIGS. 8C and 8D are plan views of fiducials for a set of X alignment marks and a set of Y alignment marks, respectively, according to a fifth embodiment of the present invention. In this embodiment, a combination of the fiducials illustrated in FIGS. 7A and 7C are utilized for the x-direction alignment marks illustrated in FIG. 8C and the fiducials illustrated in FIG. 8D are similar to those illustrated in FIG. 7B. For the x-direction alignment marks illustrated in FIG. 8C, a set of fiducials with a length $L_2$ are utilized for form each of the outer alignment marks. Between the two alignment marks with length $L_2$, two fiducials of length $L_1$ are formed. The use of six fiducials to form each alignment mark is merely exemplary and other numbers of fiducials can be utilized.

Figure 8E:
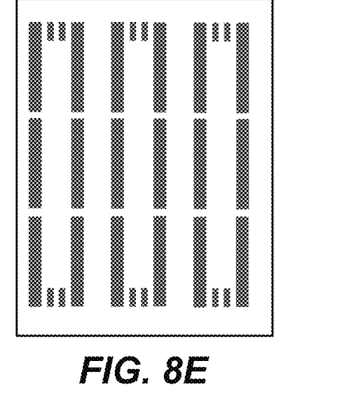
FIGS. 8E and 8F are plan views of fiducials for a set of X alignment marks and a set of Y alignment marks, respectively, according to a sixth embodiment of the present invention.
Figure 8F:
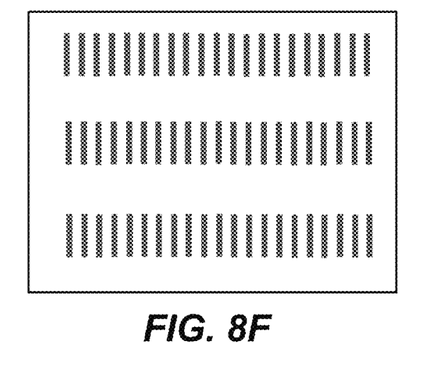

FIGS. 8E and 8F are plan views of fiducials for a set of X alignment marks and a set of Y alignment marks, respectively, according to a sixth embodiment of the present invention. In this embodiment, the x-direction alignment marks are based on the x-direction alignment marks illustrated in FIG. 8C, but with different length fiducials and the fiducials illustrated in FIG. 8F are similar to those illustrated in FIG. 7B. For the x-direction alignment marks illustrated in FIG. 8E, a set of fiducials with a length between $L_2$ and $L_1$ are utilized for form each of the outer alignment marks. In the embodiment illustrated in FIG. 8E, the fiducials of length $L_2$ illustrated in FIG. 8C are divided into three fiducials of length approximately $L_2/3$, but this is merely exemplary. Between the two alignment marks with length ~$L_2/3$, two fiducials of length $L_1$ are formed. The use of two fiducials is merely exemplary and other numbers of fiducials can be utilized.

Figure 9A:
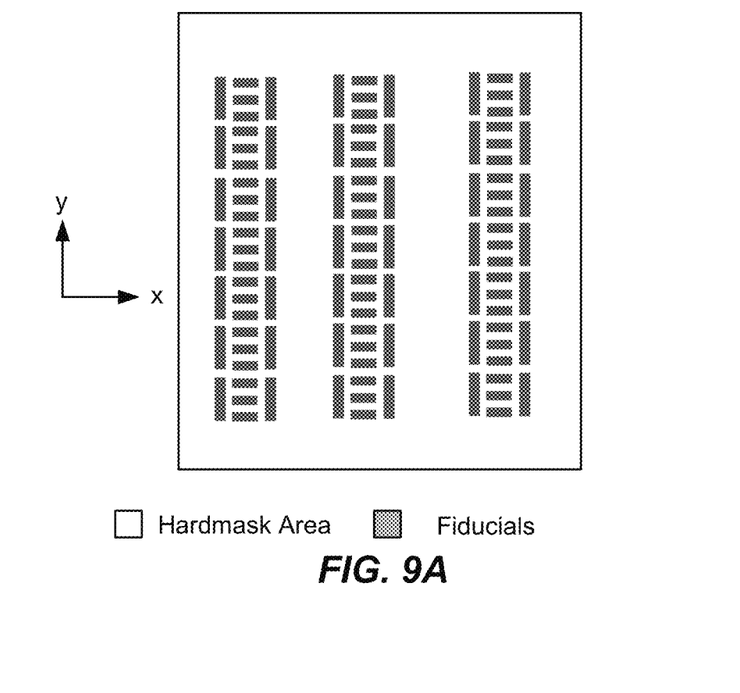
FIGS. 9A and 9B are plan views of fiducials for a set of X alignment marks and a set of Y alignment marks, respectively, according to a seventh embodiment of the present invention.
Figure 9B:
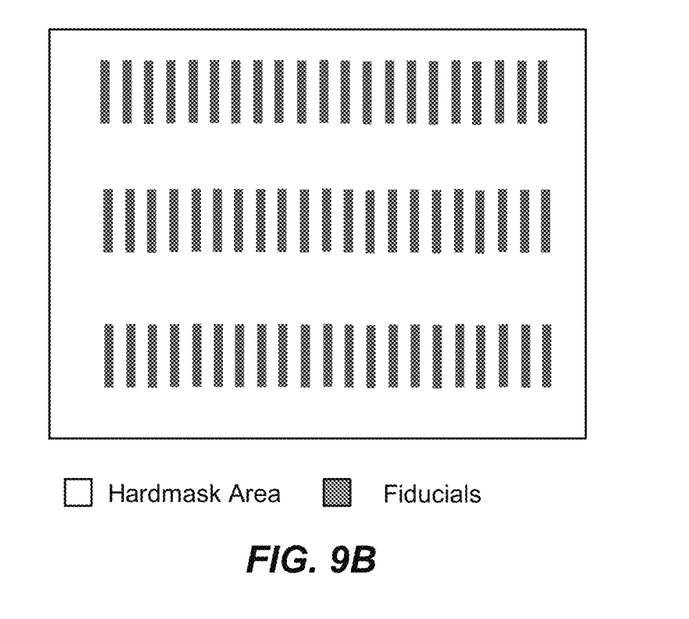

FIGS. 9A and 9B are plan views of fiducials for a set of X alignment marks and a set of Y alignment marks, respectively, according to a seventh embodiment of the present invention. In this embodiment, for the x-direction alignment marks illustrated in FIG. 9A, the orientation of a first set of the fiducials in an alignment mark is orthogonal to the orientation of a second set of the fiducials in the alignment mark. In FIG. 9A, two sets of fiducials similar to the outer sets of fiducials illustrated in FIG. 7C are utilized for the outer sets of fiducials, with each of the fiducials in the outer sets of fiducials having an equal area, which is also equal to each of the fiducials in each of the three y-direction alignment marks shown in FIG. 7B. In FIG. 9A, the fiducials in the outer sets of fiducials have a length of approximately $L_1$. In between the two outer sets of alignment marks, a set of three fiducials with an orientation orthogonal to the orientation of the fiducials in the outer sets of fiducials is formed between each of the fiducials in the outer sets of fiducials. Referring to FIG. 5, the angle $\theta_1$, representing the angle between fiducials in an alignment mark is 90°, results in different orientations for the fiducials in the outer sets of fiducials and the fiducials in the set of three fiducials between the fiducials of the outer sets of fiducials. The fiducials in the set of three fiducials can have a length of approximately $L_1$, although this is not required by the present invention. The fiducials illustrated in FIG. 9B are similar to those illustrated in FIG. 7B.

Figure 10:
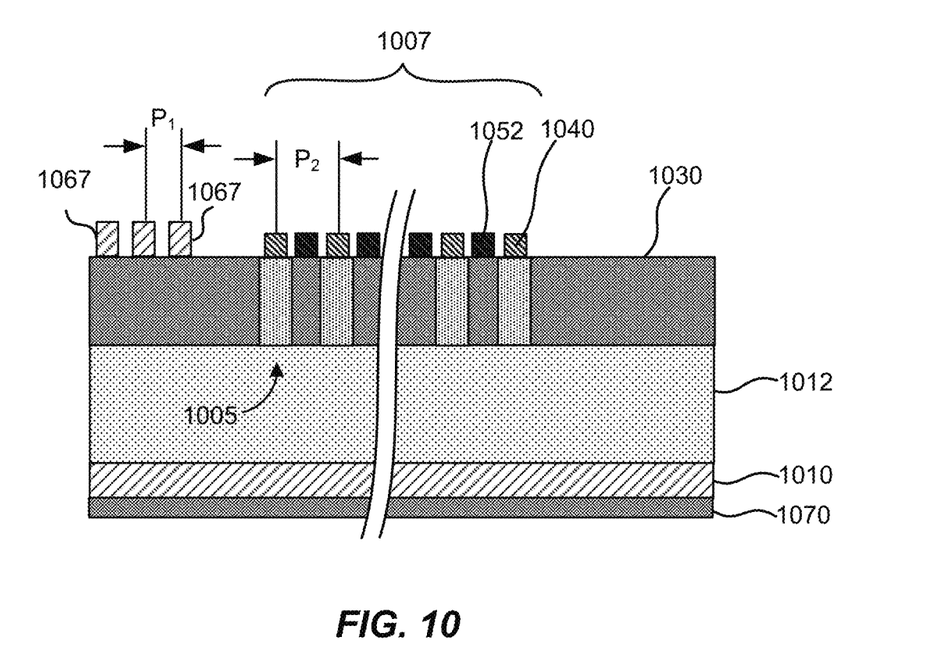
FIG. 10 is a simplified schematic diagram illustrating an array of FinFETs according to an embodiment of the present invention.

FIG. 10 is a simplified schematic diagram illustrating an array of FinFETs according to an embodiment of the present invention. As illustrated in FIG. 10, FinFETs 1005, which include fins corresponding to fins 226, are arrayed in the device region to form an array of FinFETs 1007, which, in this exemplary embodiment, includes four FinFETs disposed between portions of regrown III-nitride layer 1030. The array of FinFETs 1007 is formed on III-N substrate 1010 and first III-nitride epitaxial layer 1012. Gate contacts 1052, source contacts 1040, and drain layer 1070 are also illustrated. Fiducials 1067, which correspond to fiducials 267 discussed herein, are formed in the alignment mark region as discussed herein. Accordingly, the device region can include an array of FinFETs. A plurality of fiducials can be located in the alignment mark region. A set of fiducials of the plurality of fiducials can be characterized by a first pitch between each of the plurality of fiducials in the set of fiducials and the array of FinFETs can be characterized by a second pitch between each of the FinFETs in the array of FinFETS. The second pitch associated with the array of FinFETs can be greater than the first pitch between each of the fiducials. Referring to FIG. 10, the first pitch $P_1$ is less than the second pitch $P_2$. Additional description related to arrays of FinFETs is provided in U.S. patent application Ser. No. 18/097,693, entitled "A Vertical Fin-Based Field Effect Transistor (FinFET) with Neutralized Fin Tips," filed on Jan. 17, 2023, the disclosure of which is hereby incorporated by reference in its entirety for all purposes.

The above described embodiments have a vertical regrown semiconductor layer in the device (active) region. The alignment mark region includes an array of alignment marks that may include a variety of patterns. The device or active region may include a plurality of semiconductor fins arranged in parallel to each other. The alignment marks and the semiconductor fins can be arranged in the same direction or in different directions. In some embodiments, the alignment marks can be placed in a periphery of a wafer (substrate), in a periphery of device boundaries, or in a scribe line of a wafer (substrate). The fiducials in the alignment mark region protrude over the upper surface of the semiconductor substrate. In one embodiment, the regrown portion of the semiconductor layer in the device region has an upper surface that is substantially flush with a bottom surface of the hardmask layer, i.e., substantially flush with an upper surface of the substrate when the hardmask layer is removed. In one embodiment, the surface of the substrate is in the c-plane, and the regrowth portion of the semiconductor layer is oriented along the m-plane directions (i.e., the edge of the regrowth where it intersects the c-plane is in one of the [1000], [0100], or [0010] directions).

In one embodiment, the hardmask layer in the device or active region includes an array of elongated openings arranged in parallel to each other configured to form a plurality of semiconductor fins. In one embodiment, the elongated openings each have a width in a range between about 0.2 μm and about 0.3 μm, a length in a range between about 25 μm and about 1000 μm, and a pitch between two adjacent elongated openings is in a range between about 1.9 μm and about 10 μm. The scope of the present disclosure is not limited to the arrangement of the fins in the drawings in relation to the alignment marks.

In one embodiment, the substrate is a III-V compound substrate including an n-GaN epitaxial layer, and the semiconductor layer includes a p-GaN regrown epitaxial layer.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A method of forming alignment marks, each alignment mark including a plurality of fiducials, the method comprising:
   providing a III-V compound substrate having a device region and an alignment mark region, wherein the III-V compound substrate is characterized by a processing surface;
   forming a first hardmask having a first set of openings in the device region exposing a first surface portion of the processing surface of the III-V compound substrate and a hardmask structure in the alignment mark region;
   etching the first surface portion of the III-V compound substrate using the first hardmask as a mask to form a plurality of trenches in the device region;
   epitaxially regrowing a semiconductor layer in the trenches;
   forming a second mask having one or more openings in the device region and a patterned structure in the alignment mark region, wherein the patterned structure includes a set of masked regions corresponding to the plurality of fiducials and a second set of openings; and
   removing, using the second mask, the first hardmask in the device region and a portion of the hardmask structure in the alignment mark region corresponding to the second set of openings to form the plurality of fiducials.

2. The method of claim 1 wherein each of the plurality of fiducials correspond to one of the set of masked regions.

3. The method of claim 1 wherein the second set of openings in the patterned structure are positioned between masked regions of the set of masked regions.

4. The method of claim 1 wherein the III-V compound substrate comprises a GaN substrate and a plurality of epitaxial III-V layers.

5. The method of claim 4 wherein the plurality of epitaxial III-V layers comprises an n-GaN epitaxial layer and a p-GaN epitaxial layer.

6. The method of claim 1 wherein the trenches each have a depth of about 0.8 µm and a width of about 1.8 µm.

7. The method of claim 1 wherein the plurality of fiducials each have a width between 0.1 µm and 1 µm and a pitch between 0.2 µm and 1.2 µm.

8. The method of claim 1 wherein the trenches in the device region are characterized by a first pitch and the plurality of fiducials are characterized by a second pitch less than the first pitch.

9. The method of claim 1 wherein the device region includes an array of FinFETs and wherein:
   a set of fiducials of the plurality of fiducials is characterized by a first pitch between each of the plurality of fiducials in the set of fiducials; and
   a second pitch associated with the array of FinFETs is greater than the first pitch.

10. The method of claim 1 wherein a set of the plurality of fiducials in the alignment mark region form an alignment mark.

11. The method of claim 1 wherein each of the plurality of fiducials are elongated and a length of each of the plurality of fiducials is parallel to an m-plane of the III-V compound substrate.

12. The method of claim 1 wherein the first set of openings comprise an array of elongated openings arranged in parallel to each other configured to form a plurality of semiconductor fins.

13. The method of claim 12 wherein the elongated openings each have a width in a range between about 0.2 µm and about 0.3 µm, a length in a range between about 10 µm and about 1000 µm, and a pitch between two adjacent elongated openings is in a range between about 1.9 µm and about 10 µm.

* * * * *